United States Patent
Anderson et al.

[19]

[11] Patent Number: 5,860,828
[45] Date of Patent: Jan. 19, 1999

[54] PCMCIA CARD CONNECTOR THAT MINIMIZES BENT CONTACT PINS

[75] Inventors: Christopher Scott Anderson, Bowie; Gary Sturgill Clevinger, Jr., Laurel; Donald Lee Knapp, Pasadena; Charles Forrest Mountford, Columbia, all of Md.

[73] Assignee: United States of America, Washington, D.C.

[21] Appl. No.: 873,723

[22] Filed: Jun. 12, 1997

[51] Int. Cl.$^6$ .................................................. H01R 13/64
[52] U.S. Cl. ............................................. 439/377; 439/381
[58] Field of Search ............................ 439/64, 377, 378, 439/381

[56] References Cited

U.S. PATENT DOCUMENTS

| | | | |
|---|---|---|---|
| 4,243,283 | 1/1981 | McSparran | 339/14 R |
| 5,290,174 | 3/1994 | Woratyla et al. | 439/59 |
| 5,357,402 | 10/1994 | Anhalt | 361/753 |
| 5,427,534 | 6/1995 | Spickler et al. | 439/64 |
| 5,483,422 | 1/1996 | Bowen et al. | 361/802 |
| 5,725,385 | 3/1998 | Takano et al. | 439/64 |

*Primary Examiner*—Gary Paumen
*Assistant Examiner*—Briggitte R. Hammond
*Attorney, Agent, or Firm*—Robert D. Morelli

[57] ABSTRACT

A PCMCIA card connector that minimizes bent pins by employing a U-shaped outer guide rail, having a plurality of rigidly fixed pins, having at least one movable release pin, and having at least one alignment recess; a U-shaped inner guide rail, where the inside surface of the inner guide rail is shaped like a sideways flat-bottomed "V," having at least one alignment projection, and having a plurality of apertures; at least one guide spring; and at least one U-shaped release spring so that the PCMCIA card is aligned to the fixed pins of the connector prior to insertion of the pins into the PCMCIA card and the fixed pins are supported during insertion into the PCMCIA card.

12 Claims, 9 Drawing Sheets

PCMCIA CARD CONNECTOR THAT MINIMIZES BENT CONTACT PINS

FIELD OF THE INVENTION

This invention relates to electrical connectors and, more particularly, to a PCMCIA card connector for minimizing bent pins.

BACKGROUND OF THE INVENTION

In 1989, the Personal Computer Memory Card International Association (PCMCIA) was formed. The Association was created to develop an interface specification to add peripheral components such as memory, modems, hard-drives, local area network (LAN) adapters, multimedia interface specifications etc. to lap-top computers. The Association published a specification (i.e., PCMCIA Standard Release 1.0) in June of 1990 which defines an interface for a 68-pin device that is the size of a credit card. The standard has been expanded several times with the latest release made in February of 1995 (i.e., the Personal Computer [PC] Card Standard). Each revision of the standard has added capabilities and flexibilities while maintaining the original 68-pin configuration. PCMCIA cards that follow the 68-pin standard are widely available.

The 68-pin PCMCIA card includes 68 holes, or sockets. A 68-pin PCMCIA card connector includes 68 pins that align with, and may be inserted into, the 68 holes of the 68-pin PCMCIA card. PCMCIA cards have become very popular and are being used widely.

Current designs of PCMCIA card connectors have pins that extend unsupported for distances of 3.5 mm (PCMCIA card detect pins), 4.25 mm (signal pins), and 5.0 mm (power pins). The force required to insert the pins into a PCMCIA card is sufficient to bend the pins if the PCMCIA card is misaligned with the PCMCIA card connector. Typically, a PCMCIA card connector is rigidly affixed to a host system in a way that makes it difficult and expensive to replace a damaged connector. The present invention discloses a PCMCIA card connector that supports the pins of the connector while the pins are being inserted into a PCMCIA card. Such a device is believed to eliminate, or at least minimize, pin bending in a PCMCIA card connector. The elimination, or minimization, of pin bending will eliminate, or minimize, the costs associated with replacing damaged PCMCIA card connectors.

U.S. Pat. No. 5,483,422, entitled "KEYING CARD GUIDE FOR PC CARD," discloses a PCMCIA card connector that includes a keying guide to prevent the insertion of the PCMCIA card while the card is improperly oriented with respect to the connector. U.S. Pat. No. 5,483,422 does not disclose a device for supporting the connector pins in order to prevent, or minimize, pins bending as does the present invention. U.S. Pat. No. 5,483,422 is hereby incorporated by reference into the specification of the present invention.

U.S. Pat. No. 5,427,534, entitled "CONNECTOR WITH SIDE-SWIPE CONTACTS," discloses a PCMCIA card connector that includes a sliding contact in the side of the connector for making electrical connection to a side contact of a PCMCIA card. U.S. Pat. No. 5,427,534 does not disclose a device for supporting the connector pins in order to prevent, or minimize, pin bending as does the present invention. U.S. Pat. No. 5,427,534 is hereby incorporated by reference into the specification of the present invention.

U.S. Pat. No. 4,243,283, entitled "CIRCUIT BOARD GUIDE AND GROUND CONNECTOR," discloses a circuit board guide that includes a low-impedance connection made from a ground plane conductor plate on a printed circuit board to conductive channels mounted on a chassis to receive and guide the circuit board to a position where a connector plug on the circuit board engages a connector socket on the chassis. U.S. Pat. No. 4,243,283 does not disclose a device for supporting PCMCIA connector pins in order to prevent, or minimize, pin bending as does the present invention. U.S. Pat. No. 4,243,283 is hereby incorporated by reference into the specification of the present invention.

U.S. Pat. No. 5,357,402, entitled "CARD-RECEIVING ELECTRONIC DEVICE HAVING GROUNDING SPRING," discloses a card guide that includes a ground spring for discharging static electricity on the card as the card is inserted into the guide. U.S. Pat. No. 5,357,402 does not disclose a device for supporting PCMCIA connector pins in order to prevent, or minimize, pin bending as does the present invention. U.S. Pat. No. 5,357,402 is hereby incorporated by reference into the specification of the present invention.

U.S. Pat. No. 5,290,174, entitled "ELECTRICAL CONNECTOR FOR A CARD READER," discloses an electrical connector having guiding arms that allow the electrical connector to be stacked and butted to similar electrical connectors. U.S. Pat. No. 5,290,174 does not disclose a device for supporting PCMCIA connector pins in order to prevent, or minimize, pin bending as does the present invention. U.S. Pat. No. 5,290,174 is hereby incorporated by reference into the specification of the present invention.

SUMMARY OF THE INVENTION

It is an object of the present invention to minimize bent pins in an electrical connector during insertion into a PCMCIA card.

It is another object of the present invention to minimize bent pins in an electrical connector during insertion into a PCMCIA card by supporting the pins during insertion.

It is another object of the present invention to minimize bent pins in an electrical connector during insertion into a PCMCIA card by supporting the pins using an inner guide rail and an outer guide rail.

It is another object of the present invention to minimize bent pins in an electrical connector during insertion into a PCMCIA card by supporting the pins and guiding the card so that the holes of the card are aligned with the pins of the connector.

It is another object of the present invention to minimize bent pins in an electrical connector during insertion into a PCMCIA card by supporting the pins and guiding the card so that the holes of the card are aligned with the pins of the connector where the inner surface of the inner guide rail is shaped like a sideways flat bottomed "V."

The objects of the present invention are achieved by supporting the pins of an electrical connector as a PCMCIA card, in alignment with the connector, is inserted into the connector. The preferred embodiment of the present invention employs a 68-pin PCMCIA card, but the present invention may easily be extended to any configuration of electrical connector by those skilled in the art.

The pins of a typical PCMCIA card connector may be bent when a PCMCIA card is inserted into the connector while the holes of the card are not in alignment with the pins of the connector. The present invention solves this problem by supporting the pins while a PCMCIA card is inserted into the connector.

The present invention includes an outer guide rail, an inner guide rail, at least one guide spring, and at least one release spring.

The outer guide rail is shaped like a "U," is long enough and wide enough to fit snugly around the inner guide rail, and includes pins at the bottom of the "U" that extend toward the inside of the U-shaped outer guide rail. The typical PCMCIA card connector has power pins that are 5.0 mm long, signal pins that are 4.25 mm long, and PCMCIA card detect pins that are 3.5 mm long. The outer guide rail also includes at least one alignment hole.

The typical PCMCIA card connector uses just an outer guide rail. The problem with such a connector is that the pins are unsupported while an attempt is made to insert them into a PCMCIA card. The pins may be bent if the holes of the card are misaligned with the pins. To solve this problem, the present invention adds an inner guide rail that aligns the card to the pins of the connector and supports the pins as they are inserted into the holes of the card.

The inner guide rail is retained within the outer guide rail using at least one guide spring and at least one release spring. The inner guide rail is shaped like a "U," is long enough and wide enough to accept a standard PCMCIA card, and includes holes (e.g., 68 holes) and at least one alignment projection. The holes and the at least one alignment projection are located in the bottom portion of the U-shaped inner guide rail. The alignment projection faces toward the outside of the inner guide rail. The pins of the outer guide rail pass through the holes of the inner guide rail while the at least one alignment projection is inserted into the at least one alignment hole of the outer guide rail. The inner guide rail is positioned so that the holes of the inner guide rail slide over the pins of the outer guide rail. When the connector does not contain a PCMCIA card, the at least one release spring is fully depressed into the outer guide rail. The depressed at least one release spring pushes against the at least one alignment projection of the inner guide rail and causes the inner guide rail to be positioned so that the holes of the inner guide rail are level with the shortest pins of the outer guide rail (i.e., the 3.5 mm PCMCIA card detect pins).

The inner side surfaces of the "U-shaped" inner guide rail, along which slides a PCMCIA card, is shaped like a sideways flat-bottomed "V." The sideways flat-bottomed "V" shape aligns the holes of the PCMCIA card to the holes of the inner guide rail and the pins of the outer guide rail. Upon insertion of the card, the longest pins (i.e., the 5.0 mm power pins) of the outer guide rail are contacted first and inserted into the card. Upon further insertion of the card, the next longest pins (i.e., the 4.25 mm signal pins) of the outer guide rail are contacted and inserted into the card. Upon further insertion of the card, the surface of the inner guide rail and the shortest pins (i.e., the 3.5 mm PCMCIA card detect pins) of the outer guide rail are contacted. Upon further insertion of the card, the card pushes the inner guide rail along the pins of the outer guide rail and toward the surface of the outer guide rail while the shortest pins of the outer guide rail enter the holes of the card and the at least one alignment projection of the inner guide rail is pushed through the outer guide rail and against the at least one release spring. Since the pins are being supported by the inner guide rail as they enter the PCMCIA card, the likelihood of bending a pin is minimized or eliminated.

The length of the pins in the outer guide rail may be long enough to provide the same penetration of a PCMCIA card as does a connector that does not support the pins. That is, the pins of the present invention may be as long as the length of the pins in a typical connector plus the length of the holes in the inner guide rail. Essentially, the inner guide rail slides along the pins from the tips of the PCMCIA card detect pins to the surface of the outer guide rail under control of the at least one release spring during retraction of the card and under control of the PCMCIA card during insertion of the card.

To release a PCMCIA card from the connector, the at least one release spring is depressed. The depressed at least one release spring pushes against the at least one alignment projection of the inner guide rail and forces the inner guide rail to disengage from the outer guide rail. The movement of the at least one alignment projection forces the inner guide rail to the tips of the shortest pins (i.e., the 3.5 mm PCMCIA card detect pins). Therefore, the PCMCIA card is forced to disengage from the shortest pins. From here, the card may be easily removed from the remaining length of the longest pins (i.e., 5.0 mm power pins) and the next longest pins (i.e., the 4.25 mm signal pins). That is, 1.5 mm (i.e., 5.0 mm–3.5 mm) and 0.75 mm (i.e., 4.25 mm–3.5 mm), respectively.

DETAILED DESCRIPTION

Figure 1:
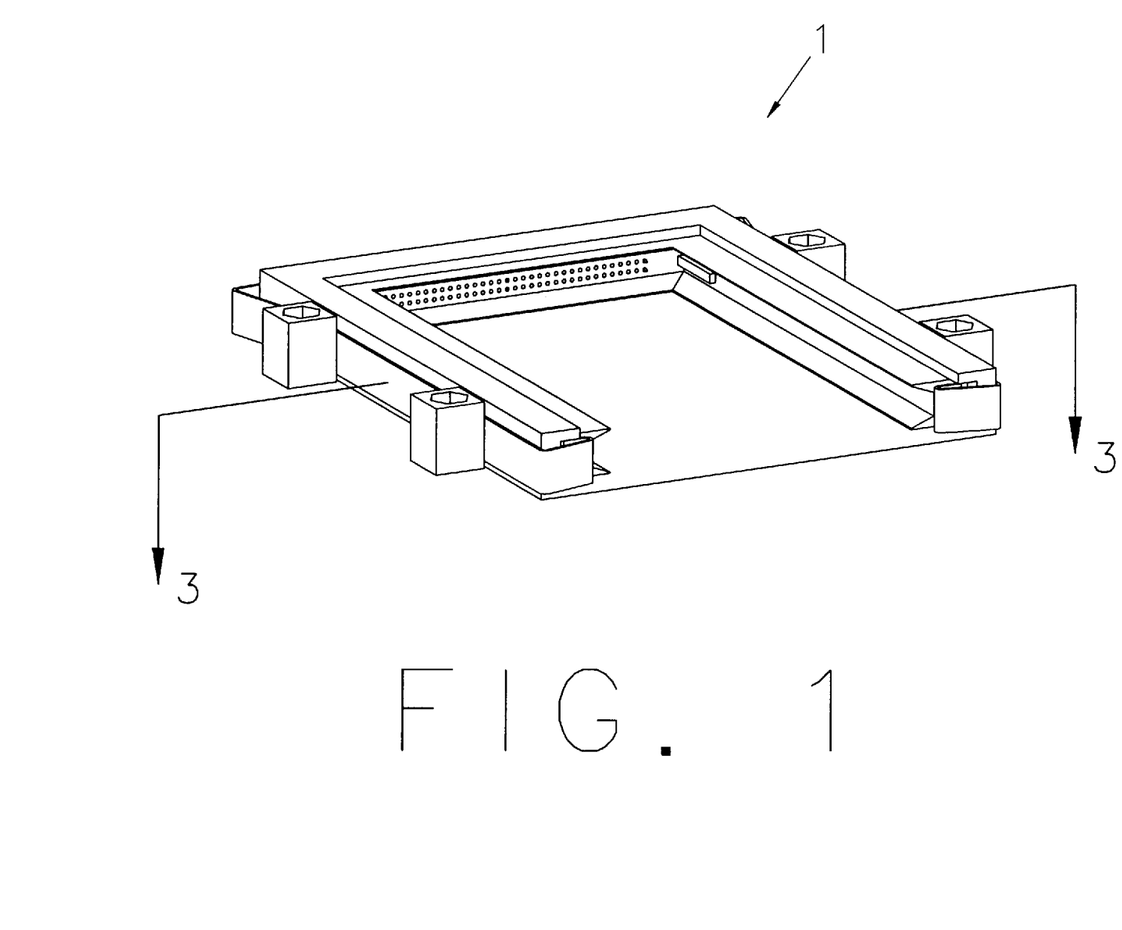
FIG. 1 is a top perspective view of the electrical connector of the present invention.

FIG. 1 is a top perspective view of the present invention which is an electrical connector 1 for minimizing the bending of pins by aligning an electronic card prior to pin insertion and supporting the pins during pin insertion. The preferred embodiment of the present invention is a 68-pin PCMCIA card connector, but the present invention may be extended to any configuration of electrical connector by those skilled in the art. The pins of a typical PCMCIA card connector may be bent when a PCMCIA card is inserted into the connector while the holes of the card are not aligned with the pins of the connector. The present invention solves this problem by aligning the card prior to pin insertion and supporting the pins during pin insertion.

Figure 2:
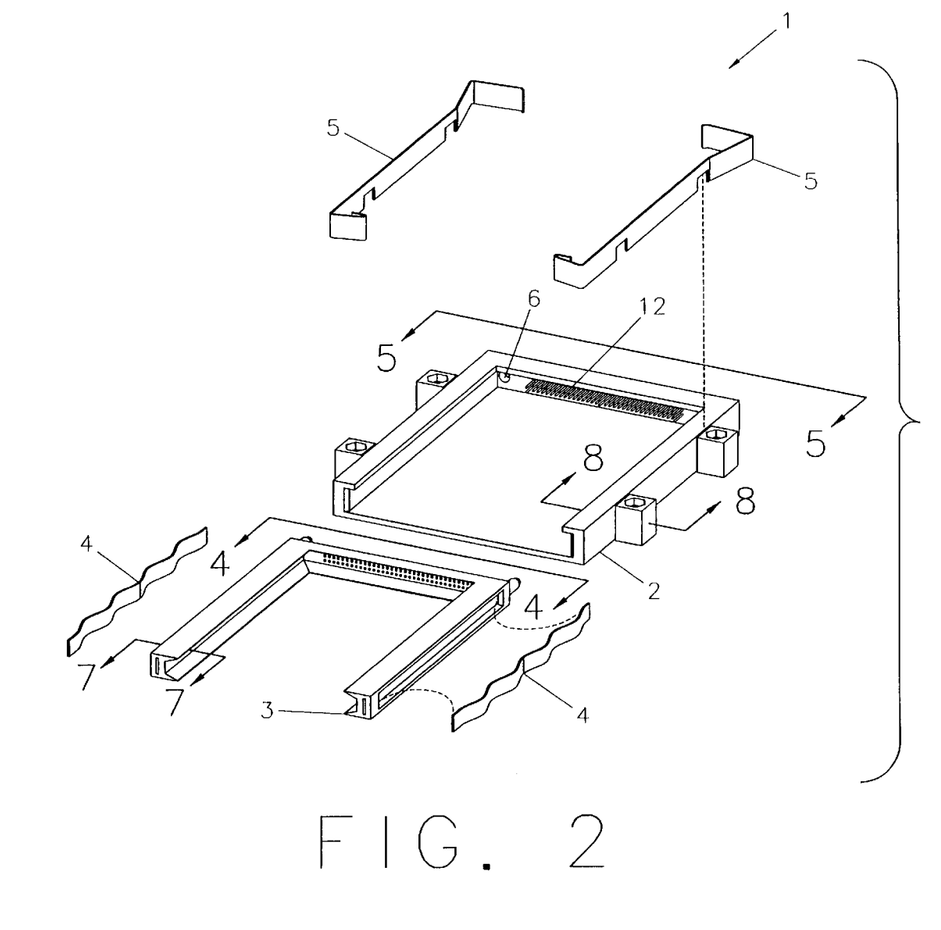
FIG. 2 is an exploded perspective view of the present invention.

FIG. 2 is an exploded perspective view of the connector 1. The connector 1 includes an outer guide rail 2, an inner guide rail 3, at least one guide spring 4, and at least one release spring 5. In the preferred embodiment, there are two guide springs 4 and two release springs 5.

The outer guide rail 2 is shaped like a "U," is long enough and wide enough to fit snugly around the inner guide rail 3, and includes pins 12 at the bottom of the U-shaped outer guide rail 2 that extend toward the inside of the outer guide rail 2. The typical PCMCIA card connector has power pins that are 5.0 mm long, signal pins that are 4.25 mm long, and PCMCIA card detect pins that are 3.5 mm long. The outer guide rail 2 also includes at least one alignment hole 6.

The typical PCMCIA card connector uses just an outer guide rail. The problem with such a connector is that the pins are unsupported while an attempt is made to insert the pins into the holes of a PCMCIA card. The pins may be bent if the holes of the card are misaligned with the pins. To solve this problem, the present invention adds an inner guide rail 3 that aligns the card to the pins 12 of the outer guide rail 2 and supports the pins 12 as they are inserted into the holes of the card.

Figure 3:
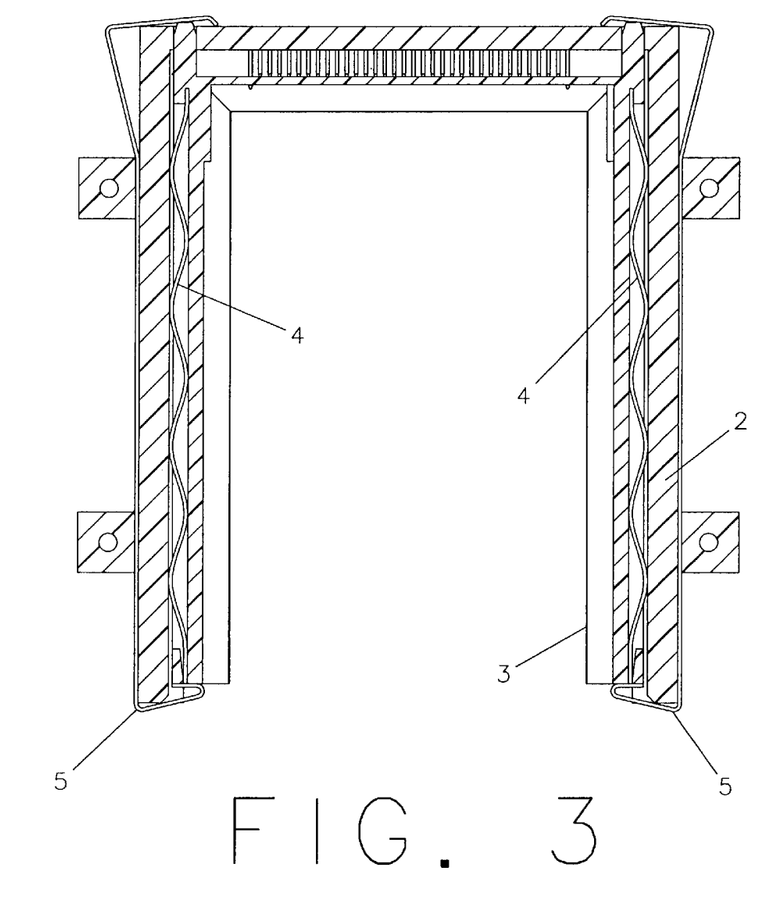
FIG. 3 is a top section taken along line 3—3 of FIG. 1 illustrating the internal components of the present invention.

FIG. 3 is a top section of the connector 1. The inner guide rail 3 is retained within the outer guide rail 2 by at least one guide spring 4 and at least one release spring 5. In the preferred embodiment, two guide springs 4 and two release springs 5 are used.

Figure 4:
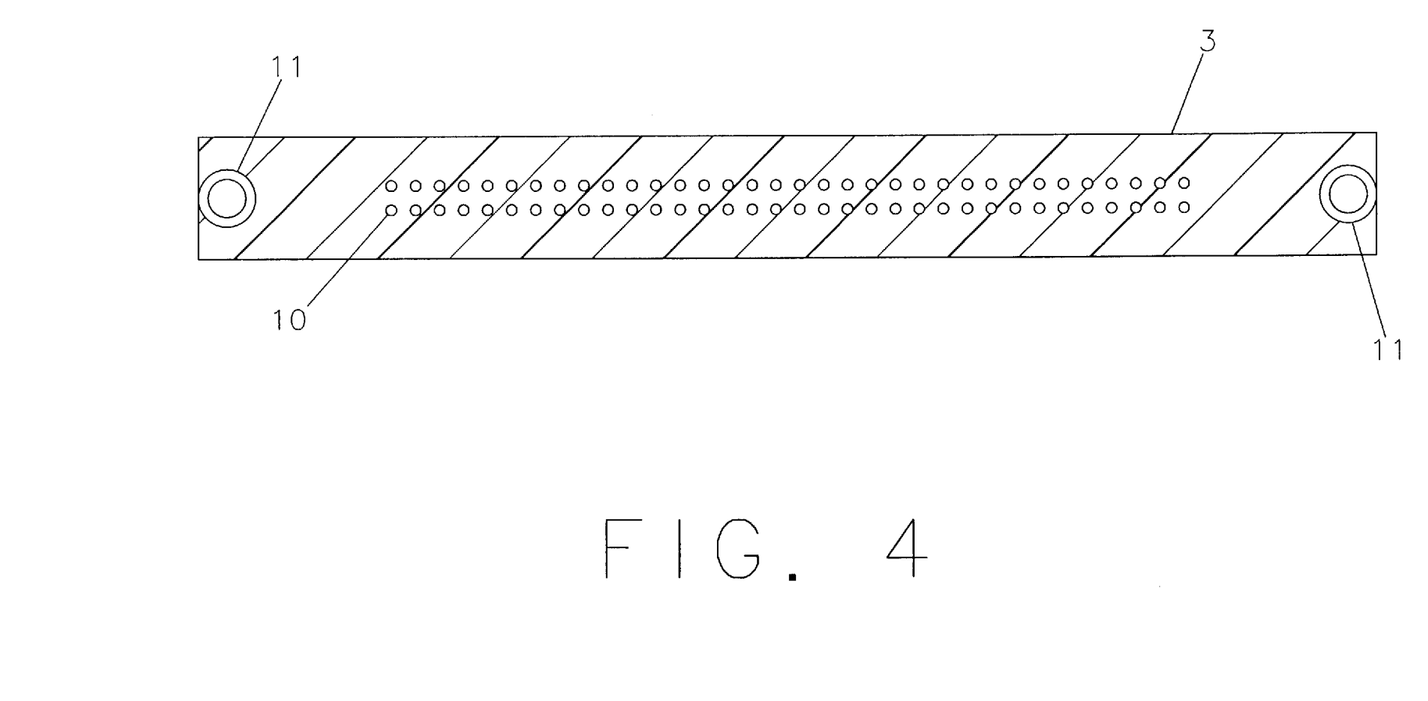
FIG. 4 is a back section taken along line 4—4 of FIG. 2 illustrating the holes and the alignment projection in the outer guide rail.

FIG. 4 is a back section of the bottom of the U-shaped inner guide rail 3. The inner guide rail 3 is long enough and wide enough to accept a standard PCMCIA card, and includes holes 10 and at least one alignment projection 11. The number of holes 10 match the number of holes in the desired PCMCIA card. The holes 10 and the at least one alignment projection 11 are located in the bottom portion of the U-shaped inner guide rail 3. The at least one alignment projection 11 faces toward the outside of the inner guide rail 3 and toward the inside of the outer guide rail 2. The at least one alignment projection 11 fits into, and is inserted into, the at least one alignment hole 6 in the outer guide rail 2 so that the holes 10 of the inner guide rail 3 align to the pins 12 of the outer guide rail 2. When fully inserted into the at least one alignment hole 6, the at least one alignment projection 11 extends through the outer guide rail 2 and presses against the at least one release spring 5.

Figure 5:
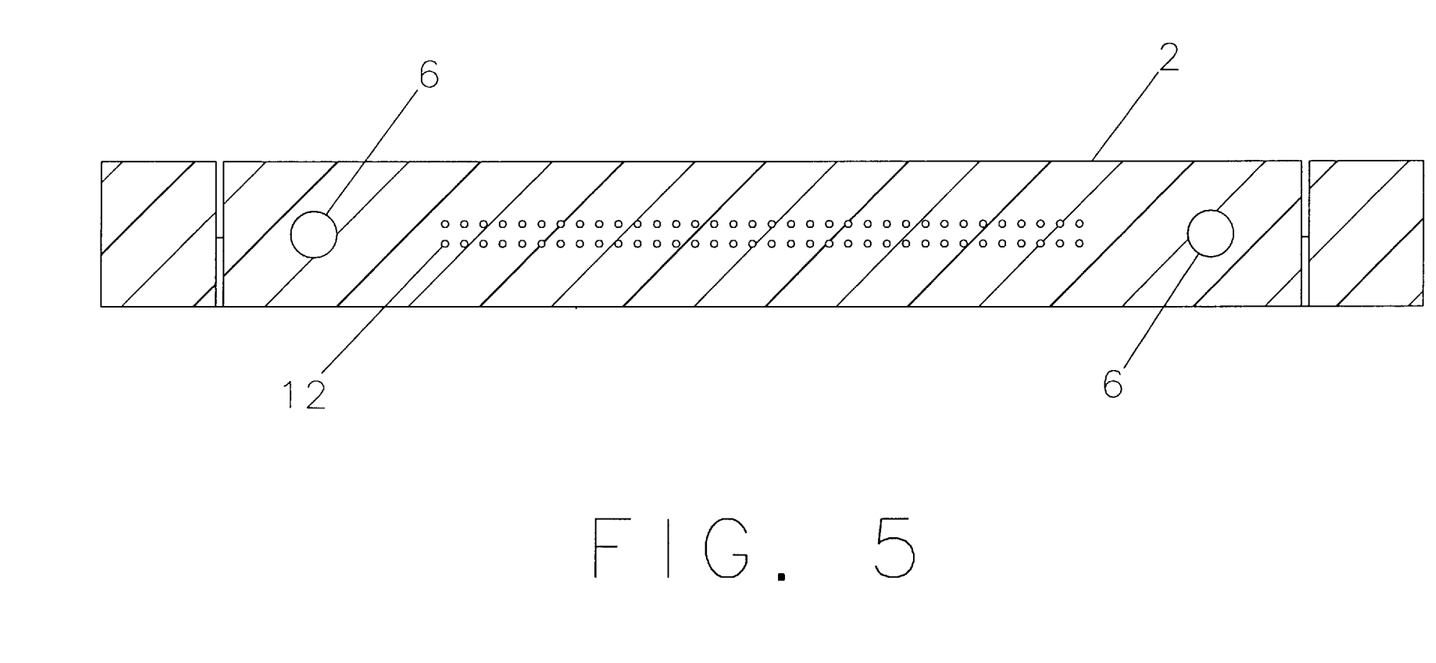
FIG. 5 is a back section taken along line 5—5 of FIG. 2 illustrating the pins and the alignment hole of the outer guide rail.

FIG. 5 is a back section of the bottom of the U-shaped outer guide rail 2. The pins 12 of the outer guide rail 2 pass through the holes 10 of the inner guide rail 3 while the at least one alignment projection 11 is inserted into the at least one alignment hole 6 of the outer guide rail 2.

Figure 6A:
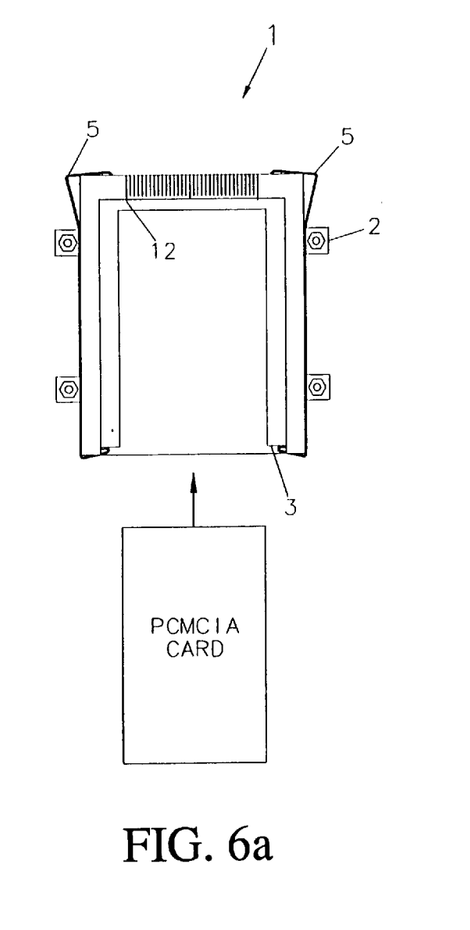
FIG. 6 is a series of three top views illustrating the insertion of a PCMCIA card into the present invention.
Figure 6B:
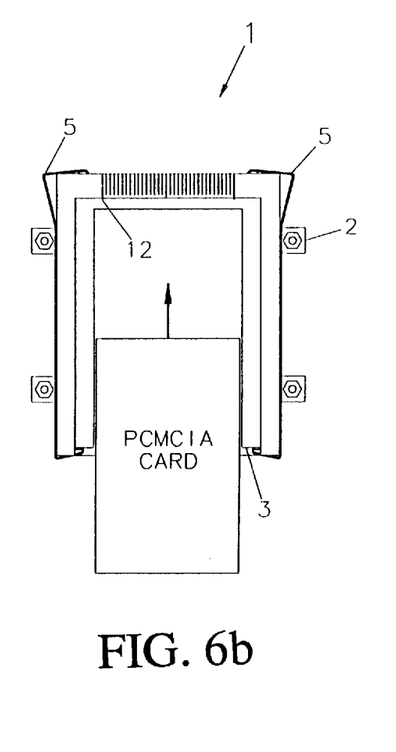
Figure 6C:
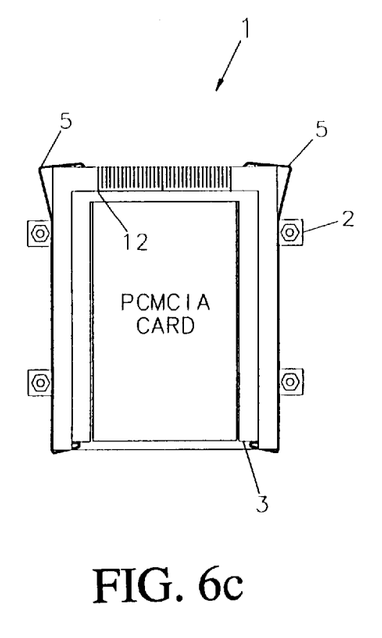

FIG. 6 is a series of views that illustrate the insertion of a PCMCIA card into the connector 1 of the present invention. The inner guide rail 3 is positioned so that the holes 10 of the inner guide rail 3 slide over the pins 12 of the outer guide rail 2. When the connector 1 does not contain a PCMCIA card, the at least one release spring 5 is fully depressed into the outer guide rail 2 (i.e., the at least one release spring 5 caused the at least one alignment projection 11 to not be fully inserted into the alignment hole 6). The depressed at least one release spring 5 causes the at least one alignment projection 11 to disengage from the alignment hole 6 and, because the at least one alignment projection 11 is connected to the inner guide rail 3, causes the inner guide rail 3 to be positioned so that the holes 10 of the inner guide rail 3 are level with the shortest of the pins 12 of the outer guide rail 2 (i.e., the 3.5 mm PCMCIA card detect pins).

Figure 7:
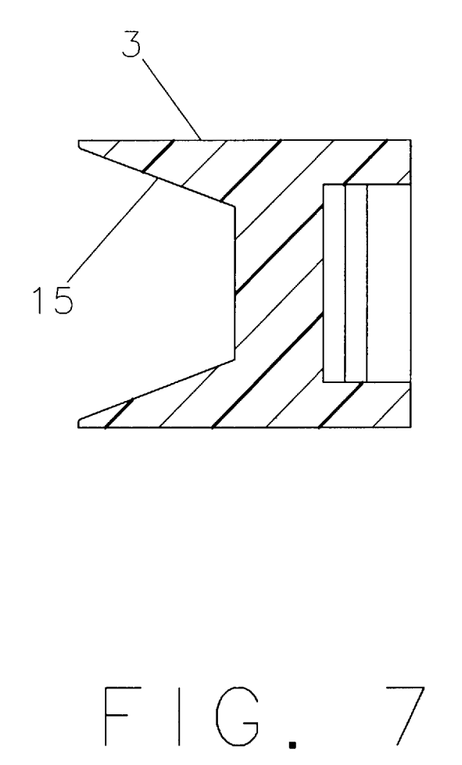
FIG. 7 is a front section taken along line 7—7 of FIG. 2 illustrating the alignment structure of the inner guide rail.

FIG. 7 is a front section of the inner side surface 15 of the "U-shaped" inner guide rail 3. The PCMCIA card slides along this surface 15 during insertion. The inner side surface 15 of the U-shaped inner guide rail 3 is shaped like a sideways flat-bottomed "V." The sideways flat-bottomed "V" shape aligns the holes of the PCMCIA card to the holes 10 of the inner guide rail 3 and the pins 12 of the outer guide rail 2.

Upon insertion of the card as illustrated in FIG. 6, the longest of the pins 12 (i.e., the 5.0 mm power pins) of the outer guide rail 2 are contacted first by the PCMCIA card and are inserted into the card. Upon further insertion of the card, the next longest of the pins 12 (i.e., the 4.25 mm signal pins) of the outer guide rail 2 are contacted and inserted into the card. Upon further insertion of the card, the surface of the inner guide rail 3 and the shortest of the pins 12 (i.e., the 3.5 mm PCMCIA card detect pins) of the outer guide rail 2 are contacted. Upon further insertion of the card, the card pushes the inner guide rail 3 along the pins 12 of the outer guide rail 2 and toward the surface of the outer guide rail 2 while the shortest of the pins 12 of the outer guide rail 2 enter the holes of the card and the at least one alignment projection 11 of the inner guide rail 3 is pushed through the at least one alignment hole 6 of the outer guide rail 2. Since the pins 12 are being supported along the entire length of the shortest pins 12 (i.e., the 3.5 mm PCMCIA card detect pins) by the inner guide rail 3 as they enter the PCMCIA card, the likelihood of bending a pin 12 is minimized or eliminated.

The length of the pins 12 in the outer guide rail 2 may be long enough to provide the same penetration of a PCMCIA card as does a connector that does not support the pins. That is, the pins 12 of the present invention may be as long as the length of the pins in a typical connector plus the length of the holes 10 in the inner guide rail 3. Essentially, the inner guide rail 3 slides along the pins 12 from the tips of the shortest of the pins 12 (i.e., the 3.5 mm PCMCIA card detect pins) to the surface of the outer guide rail 2 under control of the at least one release spring 5 (and the at least one alignment projection 11) during retraction of the card and under control of the PCMCIA card during insertion of the card.

To release a PCMCIA card from the connector 1, the at least one release spring 5 is depressed. The at least one release spring 5 forces the at least one alignment projection 11 to disengage from the at least one alignment hole 6. Since the at least one alignment projection 11 is connected to the inner guide rail 3, the movement of the at least one alignment projection 11 forces the inner guide rail 3 to the tips of the shortest of the pins 12 (i.e., the 3.5 mm PCMCIA card detect pins). Therefore, the PCMCIA card is forced to disengage from the shortest of the pins 12. From this position, the card may be easily removed from the remaining length of the longest of the pins 12 (i.e., 1.5 mm of the 5.0 mm power pins) and the next longest of the pins 12 (i.e., 0.75 mm of the 4.25 mm signal pins).

What is claimed is:

1. An electrical connector, comprising:
    a) a U-shaped outer guide rail, having a bottom portion, having a left portion perpendicular to the bottom portion, having a right portion perpendicular to the bottom portion and parallel to the left portion, having an inside surface, having an outside surface, and further including:
        i) a plurality of rigidly fixed contact pins on the inside surface of the bottom portion of said outer guide rail, where said plurality of rigidly fixed pins are parallel to the right portion of said outer guide rail; and
        ii) at least one alignment recess in the inside surface of the bottom portion of said outer guide rail;
    b) a U-shaped inner guide rail, having a bottom portion, having a left portion perpendicular to the bottom portion of said inner guide rail, having a right portion perpendicular to the bottom portion of said inner guide rail and parallel to the left portion of said inner guide rail, having an outside surface, having an inside surface, where the inside surface of the left portion of said inner guide rail and the inside surface of the right portion of said inner guide rail are each shaped like a sideways flat-bottomed "V" with the open part of the "V" of the left portion of said inner guide rail pointing toward the right portion of said inner guide rail and vice versa, having at least one alignment projection on the outside surface of the bottom portion of said inner guide rail that is in alignment with and fits snugly within and through said at least one alignment recess in said outer guide rail, where said inner guide rail fits within said outer guide rail so that the bottom portion of said inner guide rail may butt against the bottom portion of said outer guide rail, having a plurality of apertures in the bottom portion of said inner guide rail extending from the outside surface of the bottom portion of said inner guide rail to the inside surface of the bottom portion of said inner guide rail so that when said at least one alignment projection of said inner guide rail is inserted into and through said at least one alignment recess of said outer guide rail said plurality of apertures of said inner guide rail fits over said plurality of rigidly fixed pins of said outer guide rail;

c) at least one guide spring between the outside surface of the right portion of said inner guide rail and the inside surface of the right portion of said outer guide rail; and d) at least one U-shaped release spring fit snugly over the outside surface of the right portion of said outer guide rail and in contact with said at least one alignment projection of said inner guide rail when said at least one alignment projection is fully engaged in said at least one alignment recess so that depressing the at least one release spring pushes said inner guide rail along the plurality of rigidly fixed pins of said outer guide rail.

2. The device of claim 1, wherein said plurality of rigidly fixed pins on the inside surface of the bottom portion of said outer guide rail is comprised of sixty-eight pins.

3. The device of claim 1, wherein said at least one alignment recess in the inside surface of the bottom portion of said outer guide rail is comprised of two alignment recesses, where the two alignment recesses are situated on opposite extremes of the bottom portion of said outer guide rail.

4. The device of claim 1, wherein said at least one alignment projection on the outside surface of the bottom portion of said inner guide rail is comprised of two alignment projections, where the two alignment projections are situated on opposite extremes of the outside surface of the bottom portion of said inner guide rail.

5. The device of claim 1, wherein said plurality of apertures in the bottom portion of said inner guide rail is comprised of sixty-eight apertures.

6. The device of claim 1, wherein said at least one guide spring is comprised of a first guide spring and a second guide spring, where said first guide spring is between the outside surface of the right portion of said inner guide rail and the inside surface of the right portion of said outer guide rail, and where said second guide spring is between the outside surface of the left portion of said inner guide rail and the inside surface of the left portion of said outer guide rail.

7. The device of claim 1, wherein said at least one U-shaped release spring is comprised of a first U-shaped release spring and a second U-shaped release spring, where said first release spring is fit snugly over the outside surface of the right portion of said outer guide rail and in contact with a first alignment projection, and where said second release spring is fit snugly over the outside surface of the left portion of said outer guide rail and in contact with a second alignment projection.

8. The device of claim 2, wherein said at least one alignment recess in the inside surface of the bottom portion of said outer guide rail is comprised of two alignment recesses, where the two alignment recesses are situated on opposite extremes of the bottom portion of said outer guide rail.

9. The device of claim 8, wherein said at least one alignment projection on the outside surface of the bottom portion of said inner guide rail is comprised of two alignment projections, where the two alignment projections are situated on opposite extremes of the outside surface of the bottom portion of said inner guide rail.

10. The device of claim 9, wherein said plurality of apertures in the bottom portion of said inner guide rail is comprised of sixty-eight apertures.

11. The device of claim 10, wherein said at least one guide spring is comprised of a first guide spring and a second guide spring, where said first guide spring is between the outside surface of the right portion of said inner guide rail and the inside surface of the right portion of said outer guide rail, and where said second guide spring is between the outside surface of the left portion of said inner guide rail and the inside surface of the left portion of said outer guide rail.

12. The device of claim 11, wherein said at least one U-shaped release spring is comprised of a first U-shaped release spring and a second U-shaped release spring, where said first release spring is fit snugly over the outside surface of the right portion of said outer guide rail and in contact with a first alignment projection, and where said second release spring is fit snugly over the outside surface of the left portion of said outer guide rail and in contact with a second alignment projection.

* * * * *